(12) United States Patent
De Rai

(10) Patent No.: US 11,651,870 B2
(45) Date of Patent: May 16, 2023

(54) CABLE WITH SEMI-CONDUCTING OUTERMOST LAYER

(71) Applicant: PRYSMIAN S.p.A., Milan (IT)

(72) Inventor: Luca Giorgio Maria De Rai, Milan (IT)

(73) Assignee: PRYSMIAN S.p.A., Milan (IT)

( * ) Notice: Subject to any disclaimer, the term of this patent is extended or adjusted under 35 U.S.C. 154(b) by 253 days.

(21) Appl. No.: 16/833,233

(22) Filed: Mar. 27, 2020

(65) Prior Publication Data
US 2020/0312488 A1    Oct. 1, 2020

(30) Foreign Application Priority Data

Mar. 29, 2019    (IT) .................... 102019000004699

(51) Int. Cl.
| | | |
|---|---|---|
| H01B 11/22 | (2006.01) | |
| H01B 7/36 | (2006.01) | |
| G02B 6/44 | (2006.01) | |
| H01B 7/18 | (2006.01) | |
| H01B 9/02 | (2006.01) | |
| H01B 1/24 | (2006.01) | |

(52) U.S. Cl.
CPC ............ *H01B 7/361* (2013.01); *G02B 6/447* (2013.01); *H01B 7/1875* (2013.01); *H01B 9/027* (2013.01); *H01B 1/24* (2013.01); *H01B 11/22* (2013.01)

(58) Field of Classification Search
CPC .................................................. H01B 11/22
See application file for complete search history.

(56) References Cited

U.S. PATENT DOCUMENTS

| | | | |
|---|---|---|---|
| 5,018,825 A | 5/1991 | Rowland | |
| 5,042,903 A | 8/1991 | Jukubowski | |
| 6,599,961 B1 * | 7/2003 | Pienkowski | ........... A61K 6/831 |
| | | | 523/120 |
| 7,496,258 B1 * | 2/2009 | Varkey | ................. G01M 11/085 |
| | | | 385/100 |
| 9,064,618 B2 | 6/2015 | Kuchta et al. | |
| 10,788,622 B2 * | 9/2020 | Hendrickson | .......... G02B 6/036 |
| 2005/0245667 A1 * | 11/2005 | Harmon | ................... C08K 7/24 |
| | | | 523/136 |
| 2007/0295714 A1 * | 12/2007 | Liu | .......................... H05B 3/34 |
| | | | 219/553 |
| 2010/0078194 A1 | 4/2010 | Bhatt et al. | |

(Continued)

FOREIGN PATENT DOCUMENTS

| | | | | | |
|---|---|---|---|---|---|
| CA | 2693853 A1 * | 8/2010 | | ............. | H01B 9/027 |
| CN | 104893180 A * | 9/2015 | | | |
| DE | 112015002173 T5 | 2/2017 | | | |

(Continued)

OTHER PUBLICATIONS

WO 2018120048 A1 English translation (Year: 2018).*

*Primary Examiner* — Charlie Y Peng
(74) *Attorney, Agent, or Firm* — Seed IP Law Group LLP

(57) ABSTRACT

A cable includes a transmissive core; a jacket surrounding the transmissive core, which has at least an outermost polymeric layer; and an external semi-conductive layer around and in direct contact with the outermost polymeric layer of the jacket. The external semi-conductive layer is made of a composition comprising a base polymer material and an electrically conductive filler. The electrically conductive filler includes carbon nanotubes.

14 Claims, 2 Drawing Sheets

(56) References Cited

U.S. PATENT DOCUMENTS

2015/0184469 A1* 7/2015 Sherman ............... E21B 17/206
174/124 R
2019/0013112 A1* 1/2019 Jung .................... G02B 6/4427

FOREIGN PATENT DOCUMENTS

| EP | 1426804 A2 * | 6/2004 | ............ B01J 20/205 |
| EP | 2498262 A1 * | 9/2012 | ............. H01B 3/441 |
| KR | 10-2016-0121873 A | 10/2016 | |
| WO | 2017/084709 A1 | 5/2017 | |
| WO | WO-2018120048 A1 * | 7/2018 | |

* cited by examiner

CABLE WITH SEMI-CONDUCTING OUTERMOST LAYER

BACKGROUND

Technical Field

The present disclosure relates to a cable, such as an electrical cable or an optical cable having an outermost semi-conductive layer. In particular, the electrical cable is a medium voltage or high voltage cable for power transmission or distribution.

Description of the Related Art

The structure of electrical cables for power transmission or distribution may vary according to the intended applications. In general, electrical cables may be categorized as low voltage (LV), medium voltage (MV), or high voltage (HV). In the present description and claims, "low voltage" is used to indicate a voltage up to 1 kV, "medium voltage" is used to indicate a voltage of from 5 kV to 46 kV, and "high voltage" is used to indicate a voltage greater than 46 kV.

The cable generally comprises a transmissive core and a jacket having at least an outermost polymeric layer.

For MV and HV electrical cables, the transmissive core is an insulated core comprising, from interior to exterior, at least one electrical electrically conductive element, an electrical insulation system, and a metallic screen. Additional layers may also be present. The electrical insulation system generally comprises an inner semi-conductive layer, an electrically insulating layer and an outer semi-conductive layer.

For an optical cable, the transmissive core comprises at least one optical waveguide, and the cable comprises a plurality of protecting layers under the jacket and surrounding the transmissive core.

BRIEF SUMMARY

Jacket integrity tests are important because any defect in and/or damage to the jacket of the cable constitutes a discontinuity in the polymeric layer, which may ultimately cause electrical failure as the transmissive cores are no longer protected by the jacket as originally designed. For example, the presence of a cut in the jacket of the cable represents a preferential route for the entry of water or moisture to the interior (i.e., towards the core) of the cable, which may cause significant problems including short circuit and corrosion of the metal conductors.

The entry of water into a cable is particularly undesirable since, in the absence of suitable solutions provided to stop the leak, once the water has entered, it could run freely inside the cable. This particularly causes damages in terms of the integrity of the cable, since corrosion problems (affecting, for example, the armoring, if present, or the metal screen) may arise inside the cable. In the case of an electrical cable, problems of premature ageing with degradation of the electrical properties of the insulating system may arise. This phenomenon of premature ageing is better known with the term "water treeing" and gives place to branched shaped ("trees") micro-fractures due to the combined action of the electrical field generated by the passage of current in the conductor, and of the moisture penetrated into the insulating layer. In the case of an optical cable, the presence of water may impair the signal transport capacity of the optical waveguides.

As disclosed by U.S. Pat. No. 9,064,618, one jacket integrity test is known as the DC withstand test and may be conducted according to methods known in the art, such as the ICEA (Insulated Cable Engineers Association, Inc.) Standard S-108-720-2004 for Extruded Insulation Power Cables Rated Above 46 Through 345 kV (Section E5.2), 2004. In the test, a semi-conductive layer (that may be made either of graphite or of an extruded semi-conductive compound) is applied to the jacket (which is generally made of an electrically insulating material) and serves as a first electrode. The second electrode is represented by the metal component arranged in a radially internal position relative to the jacket to be tested, such as the metal screen. A DC voltage of about 150 V/mil (6 kV/mm) and up to a maximum of 24 kV is applied between the metallic screen and the applied semi-conductive layer.

If the jacket has a defect and/or damage such as to create an electrically conductive path in the thickness of the jacket between the electrodes in the test, a short-circuit condition will exist and an overcurrent will be produced. The establishment of the overcurrent condition thus enables a person to confirm the presence of damage to and/or a defect in the jacket of the cable.

In general, the DC withstand test of the jacket is performed directly at the production plant after the process for producing the cable. Sometimes, the DC withstand test is also repeated once the cable has been installed, so as to check for any evidence of damage produced in the outer jacket due to the laying operations of the cable. Repeating the testing once the cable has been installed can be highly desirable, especially in the case of underground installations in which the cable is placed directly in the ground without the aid of conduits to contain it.

Graphite has traditionally been used for the outer semi-conductive layer because it can be easily removed at one end of the cable, as required for conducting the DC withstand test. However, after the cable has been buried, graphite may offer problems during maintenance testing because the graphite is messy and it may have rubbed off during installation.

Instead of applying graphite around the jacket, a thin layer of semi-conductive polymeric material may alternatively be extruded over the jacket.

Typically, the jacket and the outer semi-conductive layer are both generally black and, thus hardly distinguishable. The jacket is usually black to aid with sunlight resistance. The semi-conductive layer is usually black, as a common and cheap way for making a semi-conductive layer is to add carbon black (defeating any other colorants) to a polyethylene material.

It is also known to make the jacket non-black for particular applications (e.g., different colored jackets in order to identify one cable from another and/or to meet a specific country law that requires different colors for different cable types; e.g., red color for MV cables).

When colored jackets are used, there is the problem that a typical black colored semi-conductive layer cannot be applied over the jacket in order to perform the integrity test, as it would nullify the purpose of the colored jacket.

In this context, U.S. Pat. No. 9,064,618 discloses an electrical cable having a semi-conductive material extruded around and in contact with an outermost layer of a cable jacket. The semi-conductive layer may be of a color other than black and may be at least a material selected from the group of conductive polymers consisting essentially of polyaniline, polypyrrole and polyacetylene, which are per se conductive materials.

Jacket integrity tests may also be applied to optical cables. Optical cables may equally suffer performance decline or impairment in case of damage to the outer jacket, for example, because of water penetration. Optical cables may be successfully tested by, for example, the above-mentioned jacket integrity standard when they comprise at least one metallic element in radial internal position with respect to the outer jacket, such as armor, strength elements or tube housing optical waveguides.

The Applicant notes that the electrically conductive polymers proposed by U.S. Pat. No. 9,064,618 may be disadvantageous in terms of costs (they are generally more expensive with respect to a non-conductive polyethylene polymer loaded with carbon black) and in terms of compatibility with the base polymer material typically used for the jacket (e.g., low density polyethylene (LDPE), medium density polyethylene (MDPE), high density polyethylene (HDPE), polyvinyl chloride (PVC)). The compatibility of the materials of the jacket and the external semi-conductive layer is important, for example, to attain a suitable adhesion during the extrusion process of the semi-conductive layer over the jacket.

In view of the above, the present disclosure provides a cable with an external semi-conductive layer, which has reduced cost and improved compatibility of the materials of the jacket and the external semi-conductive layer, and that enables providing an external semi-conductive layer of the color requested by the standard and/or by the customer.

The Applicant also recognizes that it is useful that the different elements of a cable are visually distinguishable from each other.

This can be advantageous, for example, when making cable joints where the electrical conductors of two electrical cables are jointed to each other. To perform the joint, the elements of the two cables external to the electrical conductors are removed to enable said jointing. Then, the removed external elements must be restored at the joint, taking care that the restored elements are jointed to the diverse external elements of the two cables to match them (e.g., in position, thickness, etc.) as exactly as possible. This operation is easier when the cable elements are visually distinguishable from each other, typically by color.

The present disclosure provides a cable with an external semi-conductive layer visually distinguishable from the jacket, even when the latter is black.

Accordingly, in a first aspect the present disclosure relates to a cable comprising:

a transmissive core;

a jacket surrounding the transmissive core, the jacket having an outermost polymeric layer; and an external semi-conductive layer around and in direct contact with the outermost polymeric layer of the jacket, the external semi-conductive layer being made of a composition comprising a base polymer material and an electrically conductive filler, wherein the electrically conductive filler comprises carbon nanotubes.

In an embodiment, the cable of the present disclosure is an electrical cable for power transmission or distribution and the transmissive core is an insulated core comprising an electrically conductive element surrounded by an electrical insulating system and a metallic screen. The electrical insulating system comprises an inner semi-conductive layer, an insulating layer and an outer semi-conductive layer.

In an embodiment, the cable of the present disclosure is an optical cable for telecommunication, the transmissive core comprises at least one optical waveguide, and the cable comprises a plurality of protecting layers under the jacket and surrounding the transmissive core, of which at least one is metallic. Examples of protecting layers are polymeric coating, buffer, polymeric or metal tube, water-blocking filler, metallic water barrier, flame retardant polymeric layer, fire-resistant glass or mica layers, metal armor in form of wires or optionally corrugated sheath.

The optical waveguide comprises a glass core and a glass cladding.

The Applicant notes that the use of a base polymer material made, for example, of an ethylene homopolymer, ethylene copolymer or PVC enables obtaining a cable which has reduced cost, due to such a base polymer material being less costly with respect to the electrically conductive polymers, and improves the affinity between the outer jacket and the external semi-conductive layer, as the base polymer material of the latter is the same, similar or chemically compatible with the base polymer material typically used in the art to make the jacket.

At the same time, thanks to its high electrically conductive properties, the carbon nanotubes as electrically conductive filler can be used in a minimal percentage that, on the one side, is sufficient to provide the base polymer material of the external semi-conductive layer with the required electrical conductivity for integrity tests and, on the other side, does not affect the natural color thereof.

Thus, the base polymer material of the external semi-conductive layer of the present disclosure can be made suitably conductive while keeping its natural color which, in the case of polyethylene material, is substantially transparent.

Moreover, depending on the specific needs, it is possible to make the external semi-conductive layer colored, by adding a colorant to the base polymer material.

In this way, either in the case of colored semi-conductive layer or in the case of transparent semi-conductive layer with colored jacket, it is possible to obtain a cable which has—as a whole—a colored exterior appearance other than black (e.g., to meet customer and/or law requirements), to which an integrity test can be performed.

In the present description and claims, the expression "transparent" in connection with a material of a cable layer is used to indicate that the material enables a user to see through it, for example, to see through it the color of the underlying layer.

The present disclosure, in at least one of the disclosed aspects, may be implemented according to one or more of the following embodiments, optionally combined together.

In an embodiment, the electrically conductive filler comprises carbon nanotubes in an amount of at least 0.05 wt % with respect to the total weight of the semi-conductive layer composition. For example, the electrically conductive filler comprises carbon nanotubes in an amount of 0.5 wt % at most. The Applicant observed that this amount of carbon nanotubes can be sufficiently high to provide a semi-conductive layer with the electrical conductivity required, for example, to perform an integrity test, and at the same time could maintain the natural appearance or coloring of the base polymer material which is visually perceivable. For the sake of comparison, it is noted that to obtain similar values of electrical conductivity with carbon black as electrically conductive filler, an amount of 20-25 wt %, with respect to the weight of the semi-conductive composition is required. Such an amount completely changes the natural appearance or the coloring of the base polymer material of a semi-conductive layer by blackening it.

In an embodiment, the external semi-conductive layer of the present cable has an electrical conductivity of at least $10^{-2}$ S/cm (corresponding to a resistivity of 1 Ω*m) as measured, for example, according IEC 60093, $2^{nd}$ ed., 1980 (volume resistivity).

In an embodiment, the external semi-conductive layer of the present cable can have an electrical conductivity of $10^{-1}$ S/cm (corresponding to a resistivity of $10^{-1}$ Ω*m) at most.

In an embodiment, the electrically conductive filler consists of carbon nanotubes only.

The electrically conductive filler of the present disclosure is devoid of carbon black. This to avoid altering, and in particular, blackening, the natural appearance or the coloring of the base polymer material of the semi-conductive layer.

In an embodiment, the electrically conductive filler comprises an amount of carbon nanotubes suitable to provide a conductivity of at least $10^{-2}$ S/cm (corresponding to a resistivity of 1 Ω*m).

In an embodiment, the electrically conductive filler comprises an amount of carbon nanotubes adapted to achieve a conductivity of $10^{-1}$ S/cm (corresponding to resistivity of $10^{-1}$ Ω*m) at most.

The Applicant observed that the above values of conductivity are suitable to perform a jacket integrity test wherein a DC voltage of about 150 V/mil (6 kV/mm) and up to a maximum of 24 kV is applied between the metallic screen and the external semi-conductive layer to verify the integrity of the jacket.

In an embodiment, a thickness of the semi-conductive layer is up to 20% of a combined thickness of the jacket and the semi-conductive layer.

In an embodiment, the external semi-conductive layer of the cable is different in color from the outermost polymeric layer of the jacket, and is thus visually distinguishable therefrom. For example, the external semi-conductive layer can have the appearance of the natural base polymer material (substantially transparent in the case of polyethylene, white in the case of PVC or in case of polyethylene charged with a filler), while the jacket can be black (to aid with sunlight resistance) or of any other color (e.g., to meet customer and/or law requirements, as in the case of MV cables). In another example, the external semi-conductive layer can be colored while the jacket can be left uncolored (as hidden from the sunlight) or colored in a different color.

In an embodiment, the external semi-conductive layer is of a color other than black.

In an embodiment, the external semi-conductive layer also comprises a colorant. The Applicant noted that the above cited amount of carbon nanotubes is sufficiently low to guarantee that the color imparted to the base polymer material by the colorant is maintained and not blackened by the electrically conductive filler.

In an embodiment, the external semi-conductive layer comprises the colorant in an amount of at least 0.01 wt %, with respect to the total weight of the semi-conductive layer composition.

In an embodiment, the external semi-conductive layer comprises the colorant in an amount of 2.5 wt % at most, for example, of from 0.015 wt % to 1.2 wt %, with respect to the total weight of the semi-conductive layer composition. Colorants suitable for the polymeric material of the external semi-conductive layer can be readily selected by the skilled person. See, for example, Fundamentals of Color and Additives, Utilization of Color & Additive Concentrates, Clariant International Ltd, 2013.

The jacket underlying the external semi-conductive layer can be of any color. When the external semi-conductive layer is transparent because of the lack of any coloring agent in a material, per se transparent, like polyethylene, the color of the jacket is visible from the outside and can be that required by the customer and/or by the standard.

In an embodiment, the jacket and the external semi-conductive layer are of substantially the same color.

The carbon nanotubes may be single walled or few-walled (e.g. 2 or 3 walls). The Applicant notes that with respect to multi-walled (e.g. more than 3 walls) carbon nanotubes, single walled or few-walled carbon nanotubes can display higher conductivity values at the same concentration.

In an embodiment, the external semi-conductive layer can include UV additives to improve sunlight resistance for the cable, with the provision that it preserves the color of the external semi-conductive layer unchanged. Examples of UV additives for sunlight resistance are based on titanium dioxide.

The base polymer material of the external semi-conductive layer according to the present disclosure is per se non-electrically conductive.

In an embodiment, the base polymer material of the external semi-conductive layer may be selected from: polyethylene (for example, high density polyethylene, HDPE), ethylene propylene rubber (EPR), ethylene vinyl acetate (EVA) or a mixture thereof, such polymers or polymer mixtures being possibly low smoke zero halogen (LSOH) material, charged with an inorganic non-halogenated flame retardant filler, like magnesium hydroxide. In another embodiment, the base polymer material of the external semi-conductive layer is made of PVC.

The jacket is substantially dielectric even when made of a material containing a filler.

In an embodiment, the jacket is made of a polymer material selected from low density polyethylene (LDPE), medium density polyethylene (MDPE), high density polyethylene (HDPE), polyvinyl chloride (PVC), or a LSOH material.

In an embodiment, the jacket is monolayered with the outermost polymeric layer being its only layer. Alternatively, the jacket may have two or more polymeric layers, one being an innermost polymeric layer and another being the outermost polymeric layer.

The cable can be an electrical DC or AC cable.

In an embodiment, the cable is terrestrial. The terrestrial cable can be at least in part buried, optionally in a pipe, or positioned in vaults or tunnels.

BRIEF DESCRIPTION OF THE DRAWINGS

The features and advantages of the present disclosure will be made apparent by the following detailed description of some example embodiments thereof, provided merely by way of non-limiting examples, which will be conducted by making reference to the attached drawings, wherein.

DETAILED DESCRIPTION

Figure 1:
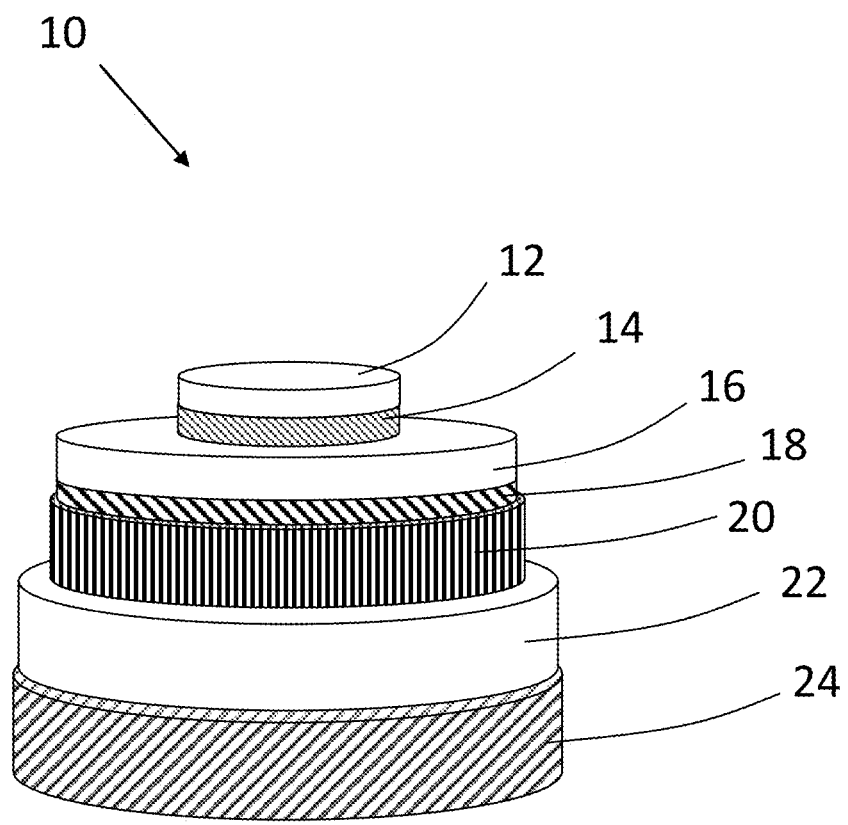
FIG. 1 is a cross-sectional view of an electrical cable according to the present disclosure.

Referring to FIG. 1, an electrical cable 10 comprises an insulated cable core (as transmissive, insulated core) comprising a conductor 12 (as electrically conductive element), an extruded inner semi-conductive layer 14 encircling the conductor 12, an extruded electrical insulating layer 16 surrounding the inner semi-conductive layer 14, an extruded outer semi-conductive layer 18, and a metallic screen 20. Additional components such as water swellable conductive or non-conductive tapes or yarns, rip cords, and the like may be included in the insulated cable core, as is known in the art. The optional water swellable tape or yarn may be capable of acting as a barrier to the penetration of water into the insulated core of the cable.

Conductor 12 may be a conductor of the electrical type or of the mixed electrical/optical type. An electrical type conductor may be made of copper, aluminum, or aluminum alloy.

Inner semi-conductive layer 14, the electrical insulating layer 16 and the outer semi-conductive layer 18 encircling conductor 12 may be made of any polymeric material known to those skilled in the art for semi-conductive shields and typically extruded over conductor 12, for example, polyolefins (homopolymers or copolymers of various olefins), olefin/ethylenically unsaturated ester copolymers, polyesters, polyethers, polyether/polyester copolymers, and blends thereof. Examples of such polymers are: polyethylene (PE), such as linear low-density polyethylene (LLDPE); polypropylene (PP); propylene/ethylene thermoplastic copolymers; ethylene-propylene rubbers (EPR) or ethylene-propylene-diene rubbers (EPDM); natural rubbers; butyl rubbers; ethylene/vinyl acetate (EVA) copolymers; ethylene/methyl acrylate (EMA) copolymers; ethylene/ethyl acrylate (EEA) copolymers; ethylene/butyl acrylate (EBA) copolymers; ethylene/a-olefin copolymers, and the like. In the case of the inner and outer semi-conductive layers 14, 18 the polymeric material is added with a conductive filler, for example, carbon black.

An exemplary thickness for electrical insulating layer 16 may be from 3 to 30 mm.

Metallic screen 20 is formed around outer semi-conductive layer 18 and may be copper concentric neutral wires, aluminum, steel, lead, or copper or aluminum laminated tape, or both. Metallic screen 20 may be a tape, which is longitudinally folded or spirally wound to form a circumferentially and longitudinally continuous layer, in a manner well known in the art. Metallic screen 20 may be a continuous tubular component or a metal sheet folded on itself and welded or sealed to form the tubular component.

Electrical cable 110 further includes a jacket 22 formed around the transmissive core. Jacket 22 is made of a polymeric material and may be formed through pressure extrusion. Jacket 22 serves to protect the cable from environmental, thermal, and mechanical hazards and substantially encapsulates the insulated cable core. Jacket thickness may depend on factors such as cable rating and conductor size and is identified in industry specifications, as are well known to those skilled in the art. As a general guide, the thickness of jacket 22 may be in the range of 1.78-4.57 mm.

Referring to FIG. 1, electrical cable 110 further includes an external semi-conductive layer 24 also applied by extrusion to surround and directly contact the jacket 22. The external semi-conductive layer 24 is made of a composition comprising an electrically conductive filler, as from the present disclosure, that enables it to be used for performing a jacket integrity test, such as the above mentioned DC withstand test, on jacket 22.

The composition of the semi-conductive layer 24 comprises a base polymer material wherein carbon nanotubes as electrically conductive filler are dispersed.

This enables the external semi-conductive layer 24 to be transparent or of any color to meet customer and/or law requirements.

A color difference between the jacket 22 and the external semi-conductive layer 24 helps to make the two layers distinguishable from each other to a field technician. When cutting off a portion of the external semi-conductive layer 24 at a cable end (e.g., to joint two cables), the technician may readily detect the boundary between the semi-conductive layer 24 and the different material underlying it.

The thickness of the external semi-conductive layer 24 may be up to 20% of the overall thickness of the combined thickness of layers 24 and 22.

Figure 2:
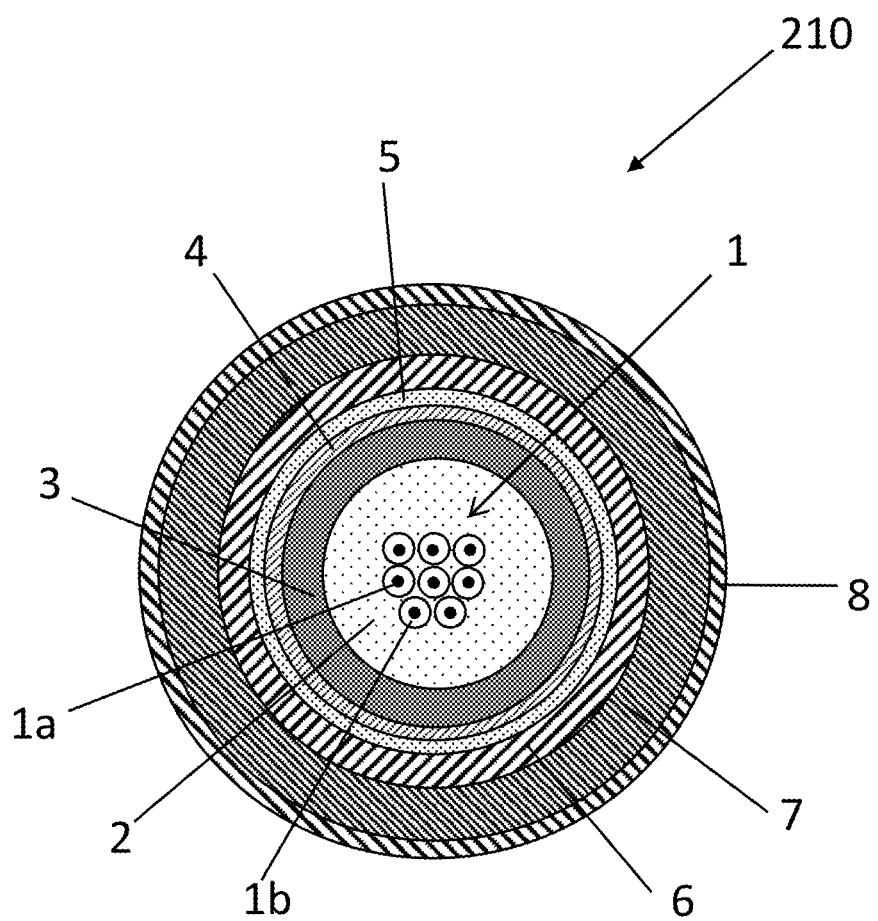
FIG. 2 is a cross-sectional view of an optical cable according to the present disclosure.

FIG. 2 shows a cross-sectional view of an optical cable according to the present disclosure. The optical cable 210 comprises a plurality of optical fibers 1. Each optical fiber 1 comprises an optical waveguide 1*a* (as transmissive core comprising a glass core and a glass cladding) surrounded by one or more polymeric coatings 1*b*.

The plurality of optical fibers 1 is housed in a tube 3 which may be of metallic or polymeric material. The tube 3 also contains a water-blocking compound 2, typically a gel.

The tube 3 is surrounded by an aramid yarn layer 4 surrounded in turn by a polyethylene layer 5.

A steel tape armor 6 surrounds the polyethylene layer 5.

The polymeric coating/s 1*b* of the optical fibers 1, the tube 3, the aramid yarn layer 4, the polyethylene layer 5 and the steel tape armor 6 are protecting layers according to the present disclosure.

Around the armor 6, a jacket 7 is provided that is made, for example, of LS0H material and surrounded by an external semi-conductive layer 8, according to the present disclosure.

It is noted that when a colored cable has to be obtained, it is suitable to obtain it by coloring the external semi-conductive layer rather than having the jacket of the desired color and the external semi-conductive layer transparent. As the external semi-conductive later is usually less thick than the jacket, a lower quantity of colorant is required to obtain the desired color.

It is noted that, even if not shown, the present description also applies to the case wherein the jacket of the cable has two or more polymeric layers.

In this case, the structural and functional features described above with reference to the jacket and the external semi-conductive layer applies to the outermost layer of the jacket and the external semi-conductive layer.

The electrical cable or the optical cable according to the present disclosure may be manufactured based on cable manufacturing techniques known to those skilled in the art. In particular, the insulated cable core of the electrical cable may be formed using conventional processes with materials, layers, and thicknesses chosen to comply with voltage requirements and needs of the particular application for the cable.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A cable comprising:
a transmissive core;
a jacket surrounding the transmissive core, the jacket having at least an outermost polymeric layer; and
an external semi-conductive layer around and in direct contact with the outermost polymeric layer of the jacket, the external semi-conductive layer including a composition of a base polymer material and an electrically conductive filler and being an outermost layer of the cable,
wherein the electrically conductive filler includes carbon nanotubes.

2. The cable according to claim 1, wherein the transmissive core is an insulated core comprising an electrically conductive element surrounded by an electrical insulating system and a metallic screen.

3. The cable according to claim 1, wherein the transmissive core comprises at least one optical waveguide, and the cable comprises a plurality of protecting layers surrounding the transmissive core, the plurality of protecting layers including at least one protecting layer that is metallic, the plurality of protecting layers being surrounded by the jacket.

4. The cable according to claim 1, wherein the external semi-conductive layer comprises a colorant.

5. The cable according to claim 1, wherein the electrically conductive filler comprises carbon nanotubes in an amount of at least 0.05 wt % with respect to a total weight of the external semi-conductive layer composition.

6. The cable according to claim 1, wherein the electrically conductive filler comprises carbon nanotubes in an amount up to 0.5 wt %, with respect to a total weight of the external semi-conductive layer composition.

7. The cable according to claim 1, wherein the external semi-conductive layer has a conductivity of at least $10^{-2}$ S/cm.

8. The cable according to claim 4, wherein the external semi-conductive layer comprises the colorant in an amount of at least 0.01 wt % with respect to a total weight of the external semi-conductive layer composition.

9. The cable according to claim 4, wherein the external semi-conductive layer comprises the colorant in an amount of at most 2.5 wt % with respect to a total weight of the external semi-conductive layer composition.

10. The cable according to claim 1, wherein the external semi-conductive layer is different in color from the outermost polymeric layer of the jacket.

11. The cable according to claim 1, wherein the carbon nanotubes are single-walled or few-walled.

12. The cable according to claim 1, wherein a thickness of the external semi-conductive layer is up to 20% of a combined thickness of the jacket and the external semi-conductive layer.

13. The cable according to claim 1, wherein the external semi-conductive layer includes UV additives.

14. The cable according to claim 1, wherein the base polymer material of the external semi-conductive layer is selected from: polyethylene, ethylene propylene rubber, ethylene vinyl acetate or a mixture thereof, optionally charged with an inorganic non-halogenated flame retardant filler; or polyvinyl chloride.

* * * * *